(12) United States Patent
Frederick

(10) Patent No.: US 10,167,998 B2
(45) Date of Patent: Jan. 1, 2019

(54) MECHANIZED AREA CONTROLLER

(71) Applicant: Frederick Energy Products, LLC, Huntsville, AL (US)

(72) Inventor: Larry D. Frederick, Huntsville, AL (US)

(73) Assignee: Frederick Energy Products, LLC, Huntsville, AL (US)

( * ) Notice: Subject to any disclaimer, the term of this patent is extended or adjusted under 35 U.S.C. 154(b) by 0 days.

(21) Appl. No.: 15/672,516

(22) Filed: Aug. 9, 2017

(65) Prior Publication Data

US 2017/0356596 A1  Dec. 14, 2017

Related U.S. Application Data

(63) Continuation of application No. 14/151,056, filed on Jan. 9, 2014, now Pat. No. 9,822,927.

(60) Provisional application No. 61/750,551, filed on Jan. 9, 2013.

(51) Int. Cl.
  *G08B 13/24* (2006.01)
  *F16P 3/14* (2006.01)
  *H03K 17/95* (2006.01)

(52) U.S. Cl.
  CPC .......... *F16P 3/145* (2013.01); *H03K 17/9502* (2013.01); *H03K 17/9522* (2013.01)

(58) Field of Classification Search
  CPC .. F16P 3/145; H03K 17/9502; H03K 17/9522
  USPC ....................................................... 340/551
  See application file for complete search history.

(56) References Cited

U.S. PATENT DOCUMENTS

| 3,794,977 | A | * | 2/1974 | Thorne-Booth | B61L 3/246 246/182 R |
| 6,549,119 | B1 | * | 4/2003 | Turner | G06K 7/0008 340/10.5 |
| 6,577,603 | B1 | * | 6/2003 | Hakalin | G01S 11/06 370/252 |
| 6,703,935 | B1 | * | 3/2004 | Chung | G06K 7/10316 340/572.1 |
| 6,864,784 | B1 | * | 3/2005 | Loeb | G08G 1/096716 180/171 |
| 7,075,427 | B1 | * | 7/2006 | Pace | B61L 23/06 246/125 |
| 7,420,471 | B2 | | 9/2008 | Frederick et al. | |
| 8,169,335 | B2 | * | 5/2012 | Frederick | G08B 21/0213 340/573.4 |
| 8,232,888 | B2 | * | 7/2012 | Frederick | F16P 3/14 340/686.1 |
| 8,847,780 | B2 | * | 9/2014 | Frederick | F16P 3/14 340/686.1 |
| 2002/0036584 | A1 | * | 3/2002 | Jocoy | G01S 13/931 342/70 |

(Continued)

*Primary Examiner* — Zhen Y Wu
(74) *Attorney, Agent, or Firm* — Blank Rome LLP

(57) ABSTRACT

Traffic control systems and methods to improve safety are disclosed. The systems, in some example aspects, include a first magnetic field generator mounted over an aisle for generating a first zone magnetic field defining a first zone. The methods, in some example aspects, include generating a first zone magnetic field defining a first zone by a first magnetic field generator mounted over an aisle. Other aspects include generating, and/or including a controller to generate, control signals to reduce the speed of a vehicle, and/or reduce the size of a danger zone.

28 Claims, 11 Drawing Sheets

(56) References Cited

U.S. PATENT DOCUMENTS

| | | | |
|---|---|---|---|
| 2006/0187046 A1* | 8/2006 | Kramer | G06K 19/0723 340/572.3 |
| 2009/0195360 A1* | 8/2009 | Jeon | H04B 5/0062 340/10.1 |
| 2009/0322512 A1 | 12/2009 | Frederick | |
| 2010/0094499 A1* | 4/2010 | Anderson | G05D 1/0295 701/23 |
| 2010/0271214 A1 | 10/2010 | Frederick | |
| 2011/0006912 A1* | 1/2011 | Sheardown | B61L 23/06 340/901 |
| 2011/0084834 A1* | 4/2011 | Sabeta | G06K 19/07758 340/540 |
| 2011/0169657 A1* | 7/2011 | August | A01K 11/004 340/854.6 |
| 2011/0278401 A1* | 11/2011 | Sheardown | B61L 23/06 246/167 A |
| 2011/0316695 A1* | 12/2011 | Li | G01S 5/02 340/539.13 |
| 2012/0025964 A1 | 2/2012 | Beggs et al. | |
| 2012/0052879 A1* | 3/2012 | Wildon | A45C 13/18 455/456.1 |
| 2012/0059574 A1* | 3/2012 | Hada | G08G 1/0112 701/119 |
| 2012/0083959 A1* | 4/2012 | Dolgov | G06T 7/223 701/23 |
| 2012/0139754 A1* | 6/2012 | Ginsberg | G08G 1/096775 340/905 |
| 2012/0161967 A1* | 6/2012 | Stern | G06Q 10/087 340/572.1 |
| 2013/0041576 A1* | 2/2013 | Switkes | G08G 1/166 701/123 |
| 2013/0049993 A1* | 2/2013 | Shi | G08G 1/07 340/928 |
| 2013/0165137 A1* | 6/2013 | Fong | G01S 19/16 455/456.1 |
| 2013/0181867 A1* | 7/2013 | Sturdivant | G06Q 30/0241 342/368 |
| 2017/0356596 A1* | 12/2017 | Frederick | F16P 3/145 |

* cited by examiner

MECHANIZED AREA CONTROLLER

This is a continuation of U.S. application Ser. No. 14/151,056 filed Jan. 9, 2014, which claims priority to U.S. Provisional Application No. 61/750,551, filed Jan. 9, 2013, which is hereby incorporated by reference in its entirety.

BACKGROUND

This disclosure relates generally to proximity detection systems at work sites, and in particular to proximity detection systems that allow system response to be altered depending on the particular operational situation.

In industrial settings, personnel are often required to work near moving machines and vehicles. Much too often, workers are injured while doing their jobs. As more equipment is used and as that equipment has become larger and more powerful, and as the operations have become more complex, many of the injuries and fatalities result from workers being struck or crushed by the moving machines/vehicles or by collisions between vehicles.

Many methods have been devised to warn people against being struck, pinched, crushed or otherwise harmed by vehicles and mobile equipment. Unfortunately, the systems that have been devised to help protect people and property in these industrial operations, such as proximity detection and collision avoidance systems, have usually not been very effective. A new proximity detection system was developed and successfully demonstrated for use on continuous miners, as disclosed in U.S. Pat. No. 7,420,471 (the '471 patent), U.S. Pat. No. 8,169,335 (the '335 patent) and U.S. Pat. No. 8,232,888 (the '888 patent), and U.S. patent publications 2009/0322512 (the '512 publication) and 2010/0271214 (the '214 publication), which patents and publications are herein referred to collectively as the "Frederick patents," the disclosures of which are incorporated herein by reference in their entireties. An objective of the '471 patent is to help prevent the crushing or pinning of personnel who are remotely controlling a continuous miner, and to help protect other personnel assisting in use of the continuous miners. The '471 patent also envisions to provide protection to personnel from other types of mobile equipment and machines. The system of the '471 patent employs a magnetic marker field and an active architecture that incorporates two-way communication between the worker and the machine the worker is near. Warnings are given to workers that are too close to the miner. Warnings are also provided to the operator of the machine. Provisions are made to immobilize the equipment until personnel were able to reach a safer position.

The magnetic fields used in the '471 patent system oscillate at low frequencies and can be effectively used to mark off warning zones, danger zones and silent zones. Although the maximum practical range of such low frequency magnetic fields may be as much as one hundred feet, in most applications that is more than is needed or desirable for most equipment. Typical very large off-highway haul trucks would probably be best served with a warning zone in the range of eighty feet and a danger zone in the range of thirty to forty feet. In some applications, such as remotely controlled continuous miners, it is necessary for the operator to remain within a range of five to ten feet much of the time in order to maintain good visual contact with the machine and the immediate surroundings. The zones are shaped to be longer in the direction of travel or movement but less in directions perpendicular to the direction of travel. In underground mines, the low frequency magnetic fields pass through earth formations unimpeded so that a worker that is around a corner, not in line of sight, or otherwise obstructed, will still be visible to the marker field. These magnetic fields do not radiate from antennas but simply expand and contract around the element that produces them, and are well suited for marking boundaries between silent zones and warning zones.

The invention is particularly applicable to work sites that require personnel to be in close proximity to various hazardous elements, such as machines, mobile equipment, remotely controlled machines, and operated vehicles. Such work environments may include locations that are inherently dangerous and should be avoided or entered only with great caution. Examples of such work environments are surface mining, underground mining, sand and gravel operations, road construction, warehouses, shipping docks, coke plants, factories, industrial sites and other environments. Hundreds of people are killed each year in the U.S. in such work environments. Workers are sometimes struck, pinched, crushed or otherwise harmed while performing their jobs in such environments. Collisions between the various elements at the work sites need to be avoided also to avert property damage.

Referring now to FIG. 1, there is illustrated a simplified example of a work site in which a proximity detection system is implemented. FIG. 1 shows a truck 304 on which a magnetic field generator (MFG) 81 is mounted. The magnetic field generator 81 generates a magnetic field 92 that surrounds the truck 304. The edge of the magnetic field 92 generated by the magnetic field generator 81 corresponds to a magnetic field strength defining the border of a Warning or Danger Zone (safety zone) surrounding the truck 304. A worker 301 within the boundary of the Warning or Danger Zone 92 is in potential danger from being struck or otherwise injured by the truck 304. The worker 301 carries a personal alarm device (PAD) 60. If the worker 301 and, correspondingly, the personal alarm device 60 are within the magnetic field 92 created by the magnetic field generator 81, the personal alarm device 60 detects the presence of the magnetic field 92 and issues a visual or audio warning. In embodiments of the magnetic field warning system, as detailed in the '888 patent, multiple magnetic field generators 81 may be used to generate Warning and Danger Zones having a complex shape around the truck 304 or other equipment or areas. These zones may be adjusted in both size and shape. In addition, safe zones may be designated near the truck 304 in which a personal alarm device 60, while within the magnetic field 92, does not generate a warning signal to the worker 301.

FIG. 2 is a diagram of the personal alarm device 60 and the magnetic field generator 81 of the proximity detection system of FIG. 1. A magnetic field generator 80 is contained within a housing 81 and includes an amplifier 84 connected to a ferrite core 90, inductor 86 and capacitor 88. In addition, the magnetic field generator 80 is connected to a power source 83 that provides the power to operate the magnetic field generator 80. The amplifier 84 is connected to and controlled by a controller 82. The ferrite core 90, inductor 86 and capacitor 88 generate a magnetic field 92 in response to an input voltage from the amplifier 84. The amplifier 84 is controlled by the controller 82 which controls the voltage and current outputs of the amplifier 84. The controller 82 is also connected to a receiver 96 and warning system 98. The receiver 96 is connected to an antenna 94 which receives an input signal 76 from a personal alarm device 60. The antenna 94 conveys the signal 76 to the receiver 96 which passes the signal 76 to the controller 82. Upon receiving the signal 76 from the personal alarm device 60, the controller 82 directs the warning system 98 to issue a warning. In one embodiment, the warning system 98 may issue an audio and/or visual warning. In another embodiment, the warning system 98 may be capable of terminating the operation of a vehicle to which the warning system 98 is mounted, for example, the truck 304 of FIG. 1. The magnetic field generator 80 may also be mounted in a location in which it is desirable to warn a worker carrying a personal alarm device 60 of their proximity to the location.

The personal alarm device 60 has x, y, and z axis magnetic field antennas 62 that sense the magnetic field 92 produced by the magnetic field generator 80. The sensed magnetic field signal 80 is passed through filters 66 and an amplifier 68 to a signal detector 64. The signal detector 64 then passes information about the detected signal to a controller 70. The controller 70 activates a transmitter 72 which transmits a corresponding response signal 76 to the magnetic field 92 through an RF (radio frequency) antenna 74. In one embodiment, the response signal 76 is an RF signal. The personal alarm device 60 is powered by power source 71. The personal alarm device 60 is carried by the worker 301 (FIG. 1) in order to provide the worker with a warning of their proximity to a magnetic field generator 80.

In such work sites, it is often necessary for workers and vehicles, such as fork lifts and lift trucks, to share the same work space. For example, workers may need to work near machines that must be serviced with supplies, materials must be delivered to worker's areas by fork trucks, etc., or vehicles may need to retrieve materials, finished products, or waste products from machines where workers are employed. However, it is also often the case that workers and vehicles must share a space, but should not concurrently be in this space. Thus, there is a need for new capabilities that will retain the safety benefits of the known proximity detection devices while allowing how MFGs and PADs respond to the operational situation to be altered, e.g., in order to ensure that workers and vehicles are not concurrently in the same area or in order to avoid false alarms in a situation where it is desired that the worker be near the vehicle/equipment.

Proximity Detection Systems and Collision Avoidance (PDS/CA) systems are being implemented on Powered Industrial Trucks such as Fork Trucks and Clamp Trucks, conveyors, haulers, personnel carriers, a wide variety of mining equipment, and other equipment. These safety systems typically give warnings to operators that the machine or vehicle is a threat to the safety of someone and gives warnings to those being threatened. They also help avoid collisions between vehicles, between vehicles and objects, or to keep the vehicles out of certain areas. They may also record information related to accidents or accident-prone conditions, or may even transmit information real-time for monitoring and tracking. The current disclosure is related to providing safety protection in highly mechanized areas and will normally be used in support of or in combination with PDS/CA systems.

Although some currently available PDS/CA systems are a very effective and practical means for reducing "hit-by" accidents in most parts of a facility, there may be highly mechanized areas where special circumstances may cause PDS/CA systems to be ineffective or to not be usable. An example would be where there are large fixed-place machines being operated by workers, mobile machines working around the fixed machines, pedestrians working in the area, and other personnel having to pass through the area for other reasons. Loading docks where pedestrians and fork trucks must work closely together can also create complex operational scenarios. Another example would be intersections where both machines and pedestrians must frequently cross paths. Another case is when fork lifts go between storage racks to store or retrieve pallets of items from the racks and workers are in the same area, even on the opposite side of the racks. Magnetic fields produced by a PDS/CA system may extend through the racks and warn a pedestrian or other mobile machine when they are perfectly safe, separated from the fork truck by the racks. The use of PDS/CA systems in these areas, and many other situations that could be listed, may be confusing, may even be disruptive to normal work and can seriously impact production. The central problem is that many alarms are given and safety is not significantly improved.

Although these mechanized locations usually involve only a very small part of a facility or industrial operation, sometimes they are the highest "hit-by" risk areas so that protection is greatly needed there. The current disclosure provides a mechanized area controller (MAC) for pedestrians and mobile machines in mechanized areas to be better protected while to a lesser degree or not at all impacting productivity or causing confusion.

There is a related reason that the present disclosure may be very important for some industrial settings. Even though PDS/CA systems can be successfully deployed throughout the majority of a facility, pedestrians and mobile machines that are effectively using those systems must from time to time, if not frequently, enter those relatively small areas where these systems would either be ineffective or disruptive to production and confusing. Therefore, facility managers can be discouraged from using PDS/CA systems to provide added safety for their workers and equipment in the large majority of their facility because of the complications in one or a few small areas. Yet, after extensive steps have been taken to try to eliminate "hit-by" accidents by more conventional means, employing training, procedures, signs, markers, and lights, accidents still occur and the managers seek a solution. A manager may consider taking drastic actions such as installing governors to slow down all mobile machines at all times. Slower speeds may reduce the frequency of some types of accidents but slower speeds may have a severe impact on production. Faster machines do more work. The present disclosure makes it more practical to deploy PDS/CA systems throughout a facility by making the PDS/CA system more useful and usable in even the more complex situations. The present disclosure utilizes system elements that cooperate with each other, and provide or interact with safety devices on mobile machines and safety devices being carried by pedestrians. These devices also provide signals to activate facility-provided warning systems. Although PDS/CA systems currently in use in mining and other industrial operations are described in detail in the Frederick patents, as well as in commercial literature, a brief review of key functional features of a PDS/CA system should be helpful to understanding this invention.

An example of a situation where PDS/CA systems are known to be effective would be a person walking behind a fork lift, not being noticed by the operator, the person being hit when the fork truck backed up. Or, a pedestrian steps out from behind an object into the path of a fork truck. Although training, procedures, and passive safety measures greatly improve safety, there still are thousands of personnel who are seriously injured by fork trucks in the US each year by simple situations. About 100 personnel are killed each year in the US, by fork truck accidents. Technology, such as PDS/CA is required to make significant reductions of "hit-by" accidents.

FIG. 4 is a diagram of a more complicated work site 100 in a warehouse, showing two fork trucks 101, 103 and a pedestrian/worker 102, where an accident can occur. Although the driver of Fork Truck 101 can easily see the pedestrian 102, and will almost always avoid hitting the pedestrian 102, sometimes the pedestrian may make an unexpected change in direction and be hit. The operator of truck 103 however cannot see the pedestrian 102 because his view is blocked by tall storage racks 104. If the pedestrian 102 were to step out in front of the truck 103 and the operator of truck 103 were to be distracted by other tasks or other events, then the pedestrian 102 might be hit. If both trucks 101, 103 are moving toward the junction where they will cross paths, they could collide. The operator of truck 101 might be distracted in passing the pedestrian 102 and drive his/her truck into the path of truck 101. Many other scenarios could occur with this kind of situation that could result in a pedestrian being hit or of trucks colliding.

Note the elliptical dashed line 107 around Fork Truck 101 and the similar line 108 around Fork Truck 103. These lines represent the magnetic field strength defining Warning level safety zones that are produced around these vehicles by the PDS/CAs on each truck. Commercial literature shows that a typical size of these elliptical fields at the warning level may have a major radius of about 44 feet. The settings in Personal Alarm Devices for the Danger level would normally be set to correspond to a major radius 60%-70% of the major radius for the warning level. This range may be adjusted for differing machine sizes and special operational considerations. The minor radius of line 107 will always be about 80% of the major radius, or about 30 feet in this case. The parameters are similar for line 108. The most effective tool for establishing these zones is using magnetic field generators 109, 110. Other techniques such as Radio Frequency transmissions are sometimes used but are less precise and less reliable. When the magnetic field represented by line 107 reaches sufficient strength at the pedestrian 102, the Personal Alarm Device (PAD) carried by the pedestrian 102 senses the proximity of the truck 101 and produces visible and audible alarms to the pedestrian 102. These alarms can have more than one level and may depend on magnetic field strength, the first being an initial warning and a second being a more intense warning signaling a greater danger. At the time the pedestrian 102 is warned, the operator of truck 101 is also given an alarm. Thus, both the pedestrian and the truck operator have warnings to give them an opportunity to take action to avoid an accident. Similarly, the magnetic field around truck 103 will also warn the pedestrian 102 and result in a warning to the operator of truck 103. Likewise, the operators of the two trucks 101, 103 will each be given a warning that they are approaching each other. The details of how these warnings are provided are included in the Frederick patents and commercial literature. The current invention is a system that manages, coordinates, and controls the movements of personnel and equipment in areas which are mechanized, and incorporates the inherent capabilities of well-designed PDS/CA systems.

It should be noted that the use of low frequency magnetic fields to establish the safety zones has been shown to the most effective available technology and will be assumed as the type of PDS/CA system included in and/or used in cooperation with the current disclosure. This invention could be adapted for use with other types of PDS/CA systems, such as RFID, by making certain changes and additions, if such other system technologies were to be improved to have sufficient precision and reliability.

The MAC could also be used in robotic areas where some or all of the operators are replaced by computers and pedestrian functions are performed by robots. Whether the operator is a person or a computer with appropriate sensors will not have a material effect on the functional value of the MAC system. Higher levels of automation would affect details about how warnings were issued and interpreted.

DETAILED DESCRIPTION OF PREFERRED EMBODIMENTS

The various embodiments described herein are particularly applicable to work sites that require personnel to be in close proximity to various hazardous elements, such as machines, mobile equipment, powered industrial trucks, remotely controlled machines, and operated vehicles. Such work environments may include locations that are inherently dangerous and should be avoided or entered only with great caution. Examples of such work environments are surface mining, underground mining, sand and gravel operations, road construction, warehouses, shipping docks, coke plants, factories, industrial sites and other environments. Workers are sometimes struck, pinched, crushed or otherwise harmed while performing their jobs in such environments. Collisions between the various elements at the work sites need to be avoided also to avert property damage.

In accordance with an exemplary embodiment, an additional device is provided in the proximity detection system which interacts with the MFGs on the vehicles and with the PADs worn by the workers, in order to alter how they respond to the operational situation, e.g., in order to ensure that workers and vehicles are not concurrently in the same area or in order to avoid false alarms in a situation where it is desired that the worker be near the vehicle/equipment. As described herein, this additional device is referred to as a multi-functional strip zone (MSZ) device.

Figure 1:
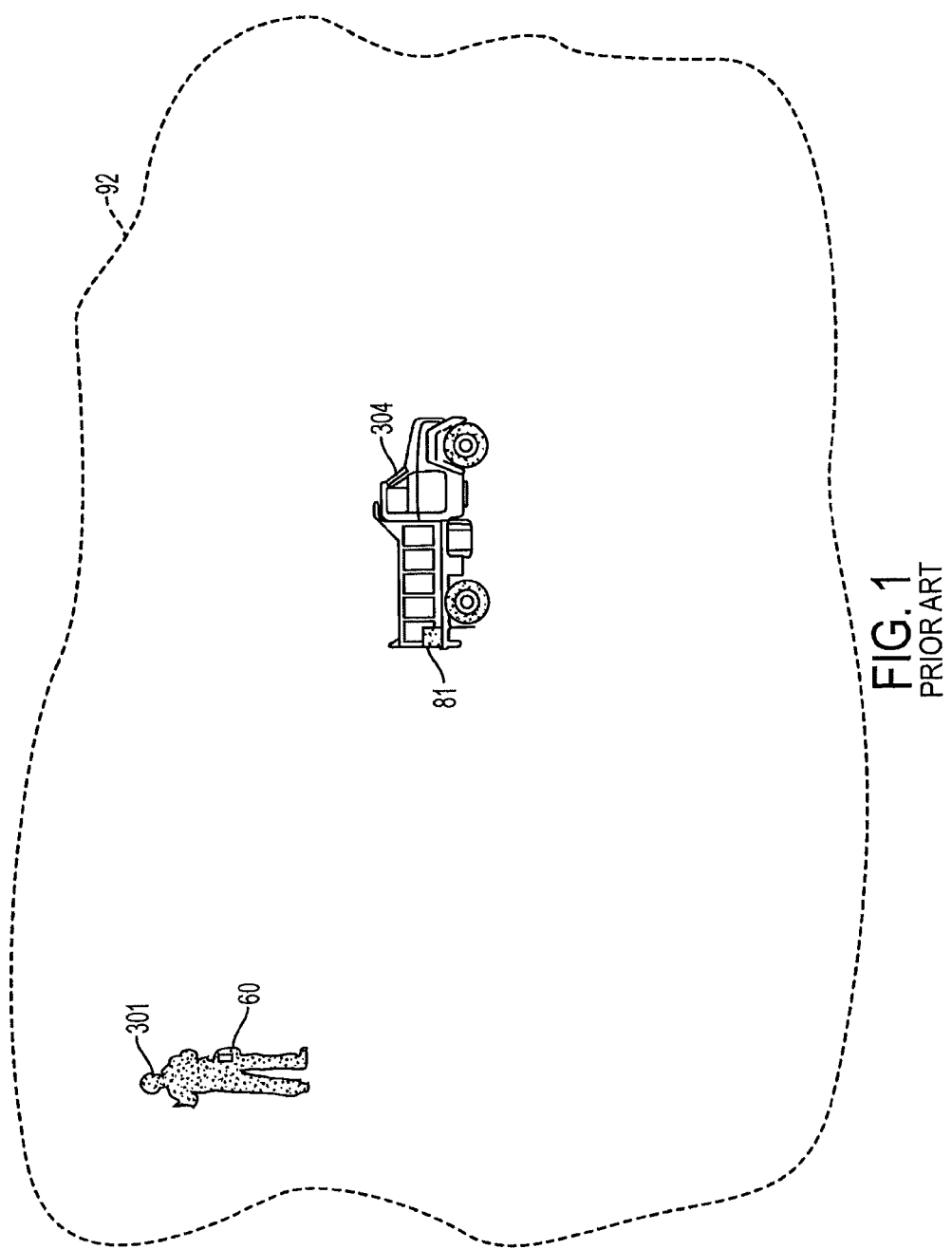
FIG. 1 is a diagram of an exemplary work site at which a proximity detection system is implemented.
Figure 2:
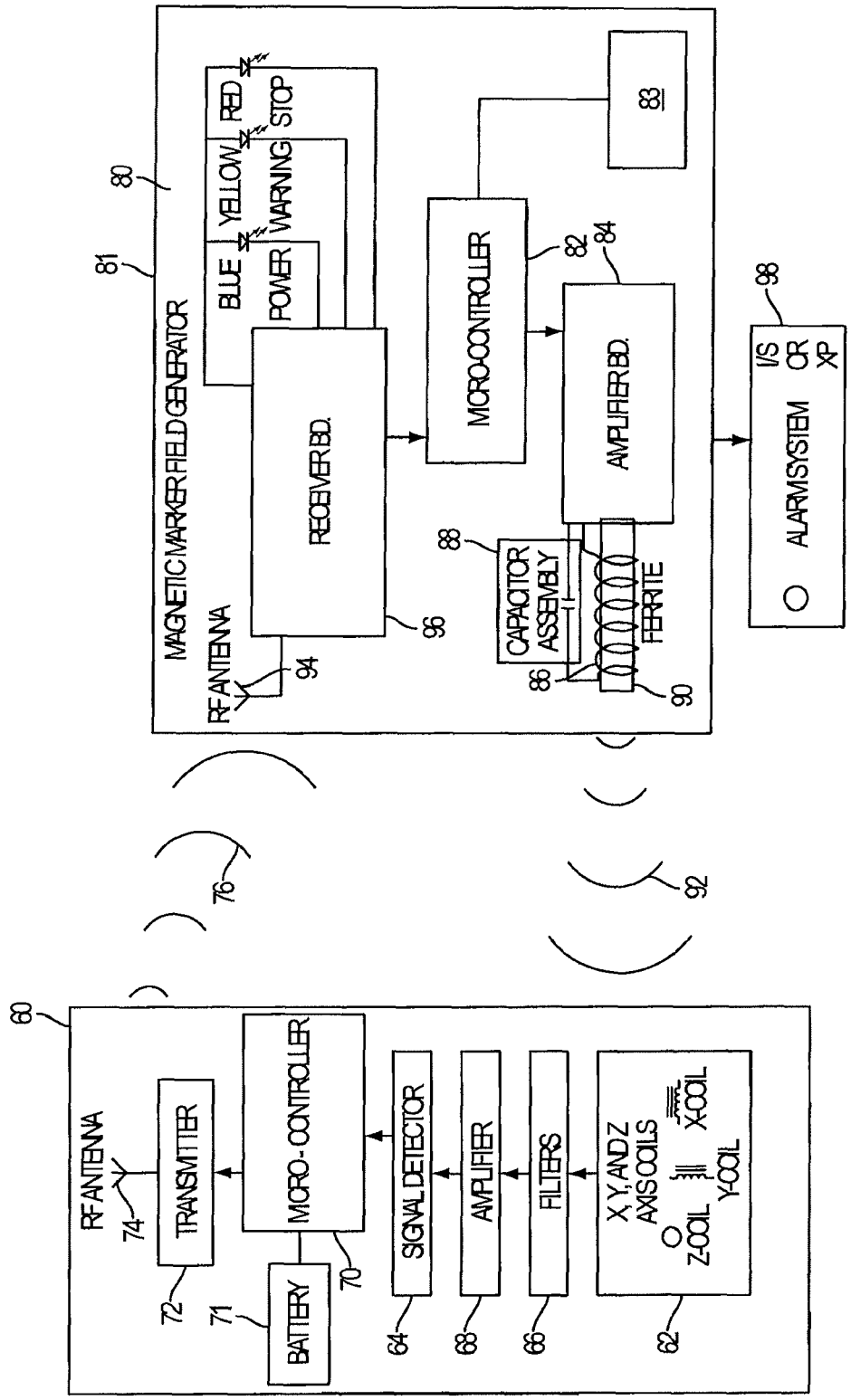
FIG. 2 is a diagram of a personal alarm device and magnetic field generator of the proximity detection system of FIG. 1.
Figure 3:
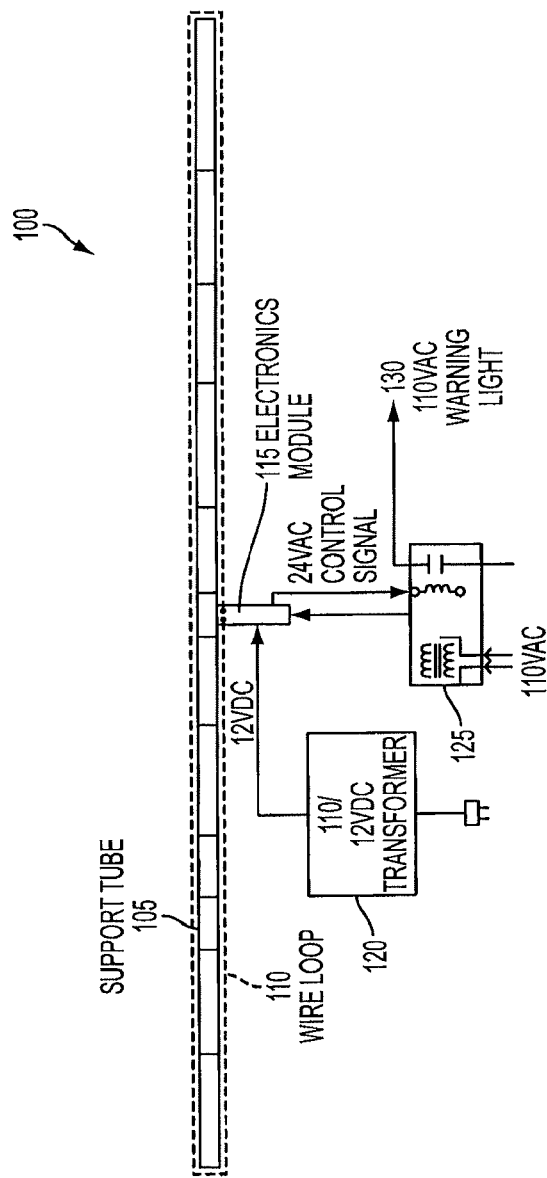
FIG. 3 is a diagram of an exemplary embodiment of the multi-functional strip zone (MSZ) device of the disclosed embodiments.
Figure 4:
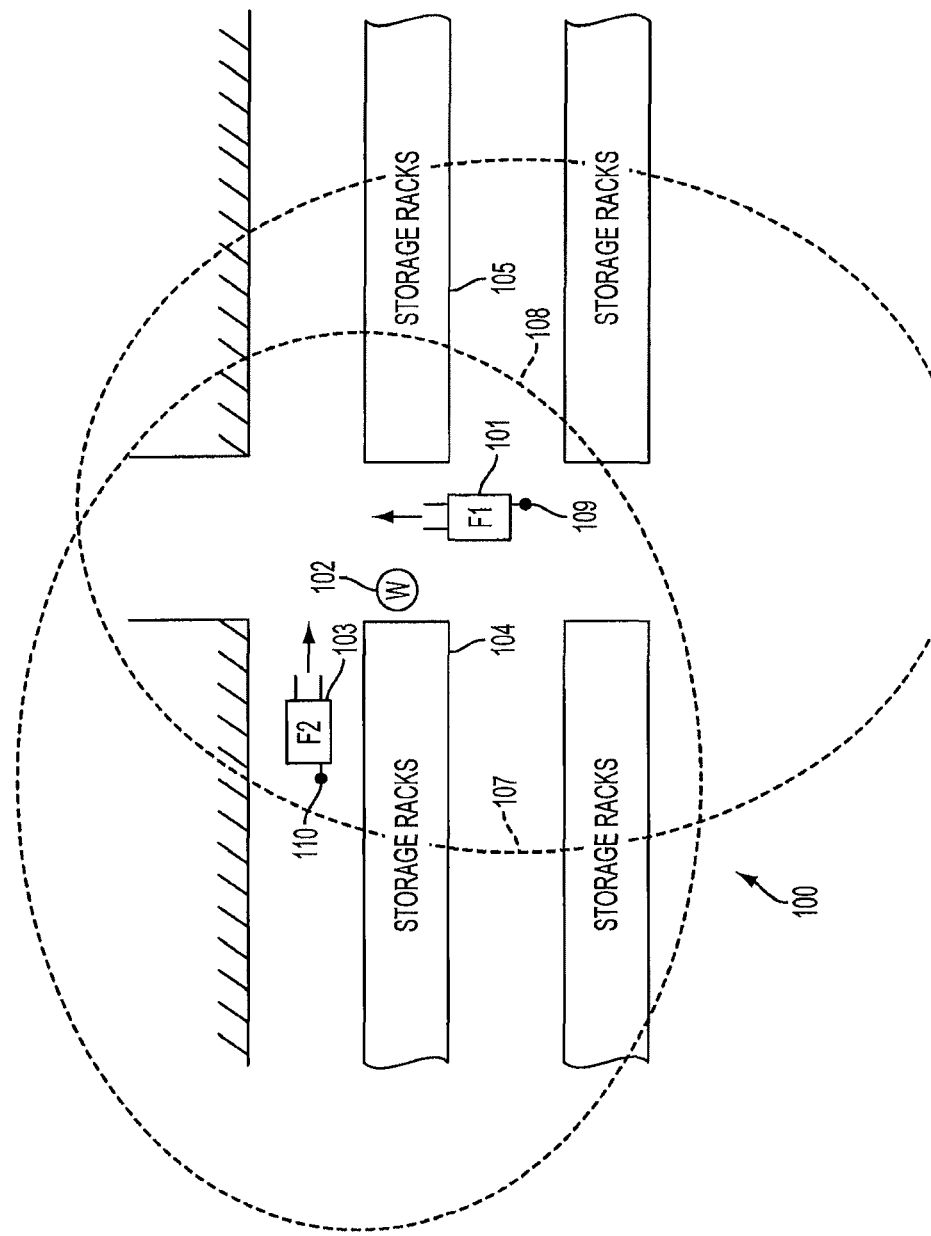
FIG. 4 is a diagram of an exemplary work site at which a PDS/CA is implemented.

With reference to FIG. 3, the MSZ device 100 includes a support tube 105 that is suspended above a work area in which workers and vehicles should alternately share the space, but should not concurrently be present. The support tube 105 may be made of any material that does not promote interference with the electronics of the system and the generation and propagation of magnetic fields, for example, any non-metallic material, for example, PVC pipe. The support tube 105 supports a wire loop 110 (shown with dotted lines) and an electronics module 115. Alternatively, wire loop 110 may be contained inside the support tube 105. The wire loop 110 and electronics module 115 act to produce a magnetic field (of controllable sizes and timing, based on, for example, the wire length, path, configuration and/or voltage provided thereto) or to act as an antenna to detect magnetic fields, for example, fields produced by proximity systems on vehicles, PADs or other field generating devices. The circuitry of the module 115 may be similar in applicable respects to the circuitry of the generator 80 and alarm device 60 (FIG. 2), except the loop replaces the ferrite core 90 and the antennae 62; and the circuitry of module 115 provides for coordination of functions of the alarm device circuitry and magnetic field generator circuitry, for example by way of a connector (not shown) between the alarm device circuitry and magnetic field generator circuitry. Additionally, as illustrated, the electronics module 115 controls the wire loop 110 to act, alternatingly, as both an MFG and as an antenna to detect pulses from other magnetic field generators in the area near the MSZ device 100.

In one embodiment, in operation, generally, the MSZ device 100 generates a field that defines a "stay-out zone," in which trucks and operators may not be present at the same time. When a truck approaches the "stay-out zone," the truck will not be warned if there are no workers in the "stay-out zone." However, if a truck attempts to enter the "stay-out zone" when a worker is present, or vice versa, a warning alarm will be activated, e.g., a visible or audible alarm, such as area-wide warning lights 130. The MSZ device 100 operates in a monitor mode if there is no truck in, or approaching, the "stay-out zone." However, once a truck is detected as approaching the "stay-out zone," the MSZ device 100 will begin to ping the PADs that might be in the area. If there are no PADs in the "stay-out zone," the MSZ device 100 will alternate between verifying that the truck is still in the "stay-out zone" and verifying that there are no PADs in the zone. If a worker is in the "stay-out zone" when the truck arrives, or if a pedestrian enters the "stay-out zone" while the truck is in the "stay-out zone," then the MSZ device 100 will echo to the MFG on the truck with a danger echo and follow up with a burst, etc. The MSZ device 100 will continue to confirm that this danger state exists and will drop the danger echoes once the truck or the pedestrian leaves the "stay-out zone." The implementation of the PING-ECHO communication of the MFGs and PADs is described in more detail in the Frederick patents.

In one particular embodiment of the MSZ device 100, which has been tested by the inventor, the support tube 105 may be 100 feet to 200 feet long. For example, the support tube 105 may be constructed with 10 foot long sections of 1 ½ in diameter, schedule 40 PVC pipe that are connected together. It is believed that the MSZ device 100 may be implemented using a support tube 105 up to 1000 feet long or longer. The wire loop 110, attached to the exterior of the support tube 105 using wire ties or other means, may be a #10 AWG insulated copper wire, in order to produce a loop that is the length of the support tube 105 and approximately 1 ¾ in in cross-section. The wire 110 may be attached on opposite sides of the tube 105 to provide separation of the wire from itself. Increasing the separation increases the size of the magnetic field generated with the wire 110. Alternatively, the wire 110 may be positioned inside the tube 105 using a lattice wire (or otherwise providing wire separation) to form the wire loop 110. The ends of the wire loop 110 are connected to electronics module 115, which is installed into a "T" section of PVC pipe near the center of the support tube 105. Alternatively, the module may be mounted at another location along the tube 105, or within the tube 105, with or without a T-section.

The electronics module 115 contains capacitors that have a reactance value equal in value to the effective reactance of the wire loop 110 on the support tube 105, so that the combined circuit resonates at 73,000 Hertz. A power supply 120, e.g., 12 VDC, is provided to the electronics module 115 to drive the electronics module 115 and the wire loop 110. A heavy duty wall adapter may be used for this purpose. A transformer/relay unit 125 is provided that sends, for example, 24 VAC to the electronics module 115 which is returned to the control relay that sends power to the area-wide warning light 130. If applicable, a second and third 24 VAC signal may be sent out to control a danger light and a green light. The circuitry configuration allows driving the tuned circuit with pulses of current at the rate of 73,000 Hz and allows the circuit to detect pulses from other MFGs in the area near the MSZ device 100. These multiple functions are accomplished with the same MSZ device 100 by alternating between these functions using manual switching or automatic switching to accomplish the same. Magnetic fields produced by the MSZ device 100 can, not only, be pings of 73,000 Hz that can be detected by standard PADs, such as those described in the Frederick patents, but also can be fields that will result in the establishment of silent zones for PADs, as described for example in the '888 patent or the '214 publication. When 12 VDC are provided, a magnetic field danger zone of about 57 feet surrounding the wire loop 110 can be produced. The size of the magnetic field can be adjusted by controlling the voltage used to generate the 73 kHz pulses to drive the field generating circuit or by controlling the width of the pulses. The field size can be automatically changed by the microcontroller during operation as determined by the logic in the microcontroller.

One example of an industrial environment in which the MSZ device 100 of the disclosed embodiments may be employed is for the implementation of safety zones near the wet end of corrugation machines, which are used, for example, for converting paper into corrugated roll or board. Fork trucks and clamp trucks must occasionally enter the area around the wet end of the corrugation machines. A "stay-out zone" area for workers must be activated behind the corrugation machine when such a truck is approaching. This "stay-out zone" includes the paper rolls that have been positioned to be ready for use in the corrugation machine. An MSZ device 100, as described above, is used to accomplish this "stay-out zone," as is further described. The MSZ device 100 may be located above the "stay-out zone." For example, the MSZ device 100 may be mounted at a height of approximately 11 feet, so as to not be in the way of machinery and workers moving through the area. For example, in a factory environment, the device 100 may be suspended from the ceiling or other structure using wires or other hangers.

Each truck is equipped with a standard MFG and continues to function in the same manner when in the area around the wet end of the corrugation machines as when in the warehouse generally. Each of the workers may be equipped with a PAD for use throughout the facility where moving vehicles are being operated, or areas that are hazardous to pedestrians. Each of the vehicles may be equipped with a vehicle alarm device (VAD) for use throughout the facility including areas where vehicles should not enter. The PAD/VAD is configured such that it can be used anywhere in the facility without being changed, including at the wet end of the corrugation machines.

When a truck approaches the "stay-out zone," an area-wide alarm light may flash intermittently, e.g., a triple flash every 10 seconds, until the truck leaves the area to alert workers that a truck is in the area and that they should not enter. At the same time, the truck operator may be given a warning in the vehicle cab by the vehicle alarm device, e.g., visible and/or audible warnings, that the truck is entering a worker "stay-out zone." Alternatively, the truck operator may not be given the warnings in the vehicle cab if there are no workers in the "stay-out zone." When a worker enters the "stay-out zone," the warning light in the vehicle cab in the zone may change from one state to another, such as for example, from flashing (or silent) to a constant red light.

Alternatively, when a truck approaches the "stay-out zone," the area-wide alarm light would not activate if there are no workers in the "stay-out zone." And would activate if a worker enters the "stay-out zone."

Alternatively, when a truck approaches the "stay-out zone," an area-wide green light may illuminate if there are no workers in the "stay-out zone." At the same time, the truck operator may be given a green light in the vehicle cab by the vehicle alarm device, indicating that the truck is entering a worker "stay-out zone" where there are no workers.

If a worker enters the "stay-out zone" while a truck is in the area, the area-wide alarm light will flash continuously, until either the worker or the truck leaves the zone. A very loud horn could also be sounded to alert workers in the area that a truck has entered the "stay-out zone" And the pedestrian must exit the stay-out zone. While each worker is equipped with a PAD, the audible alarm of the PAD is likely unable to be heard at the wet end of the corrugator machine, and thus the worker must rely on the area-wide alarm light and/or horn to alert him that a truck is entering the "stay-out zone."

Additionally, if the worker is wearing headphones, such as for communicating with other workers, the PAD may be connected to the headphones to send the audible alarm signal to headphones. Circuitry may be provided to override any other signal being sent to the headphones that may interfere with the alarm signal. In some embodiments, an operator of the corrugation machine may need to remain in an area near the machine, even when trucks are approaching the machine. A silent zone could be placed near the machine, so that the area-wide alarm light and the machine operator's PAD would not give a warning as long as the machine operator remains in the silent zone.

While the MSZ device 100 has been described herein as implementing a "stay-out zone," the MSZ device 100 could also be used to implement "safe zones." For example, an MSZ device 100 as described may be arranged above a location that is safe for people but where trucks or other machines may be passing by and warnings are not desired. Another example is to implement a "safe spots," in which a worker can stand (e.g., a mat on the floor) and an MSZ device 100 in the "spot" will silence the worker's PAD. This "safe spot" allows trucks to come into an area where workers must work, when necessary—the worker can step aside onto a safe spot, which has been positioned so that it cannot be reached by a truck, and once the truck clears the area, the worker can stop off the safe spot and return to work.

A MAC may include an MSZ device. Each MAC includes elements that can communicate to PDS/CA systems on machines and to PADs carried by pedestrians, by use of magnetic fields and has at least one UHF receiver that can receive RF responses from PADs and PDS/CA systems. Two embodiments are disclosed, MAC-A and MAC-V. The basic difference between these configurations is in the manner by which the magnetic fields are produced in order to have the fields where needed and in the preferred orientation. The MAC-A version uses a loop of wire running lengthwise around the long support tube which produces a linear shaped field around the loop/tube, as will be described later. The MAC-V version typically has two ferrite generators each of which produces a smaller magnetic field at each end of the support tube, which will also be described later. It should also be understood that the features of a MAC-A and a MAC-V can be incorporated into a single unit, where needed, but it is easier to explain the functions by keeping the two types somewhat separated in the following explanations, since the chosen illustration utilizes the two versions. However, since these two embodiments cooperate together as a system, the discussion of one of them may include mention of the other. The term "MAC" is used to also apply to MAC-A, MAC-V and/or other versions.

In order to better illustrate how the MAC may be effective in highly mechanized areas, an industrial application has been selected which is operationally challenging. By showing how the MAC-A and MAC-V would be used in this complex work environment, its powerful features can be demonstrated.

Corrugated paper products are widely used for making items such as boxes. The machines that are used to manufacture the corrugated materials are large and involve a complex combination of men and machines. A typical machine is over 150 feet long, requiring multiple workers be stationed around the corrugator machine, and requiring that it be supplied with large rolls of paper, as well as other materials. Maintenance personnel must have access to the machine. Records must be kept, including records of information on the rolls of paper. Scrap paper and other items must be continually removed from the area, usually by a fork truck. Clamp trucks are used to transport rolls of paper from a warehouse area to the machine and to be positioned on an elevator that moves the rolls into the machine as needed. Other personnel must move through the area and in adjacent work spaces. A rail-type transfer car is typically operating at the periphery of the work area. The clamp truck that delivers and positions the paper and the fork truck are known to hit pedestrians and to push or roll paper into workers. It is essential that the mobile machines and the pedestrians share use of the area behind the corrugator. The corrugator is very loud, requiring the use of hearing protection. Workers that routinely work in the noisy area wear double protection, plugs and muffs. With the inability to hear, and with the distractions from the many activities, the pedestrians are vulnerable. Accident statistics confirm the perceived danger.

Figure 5:
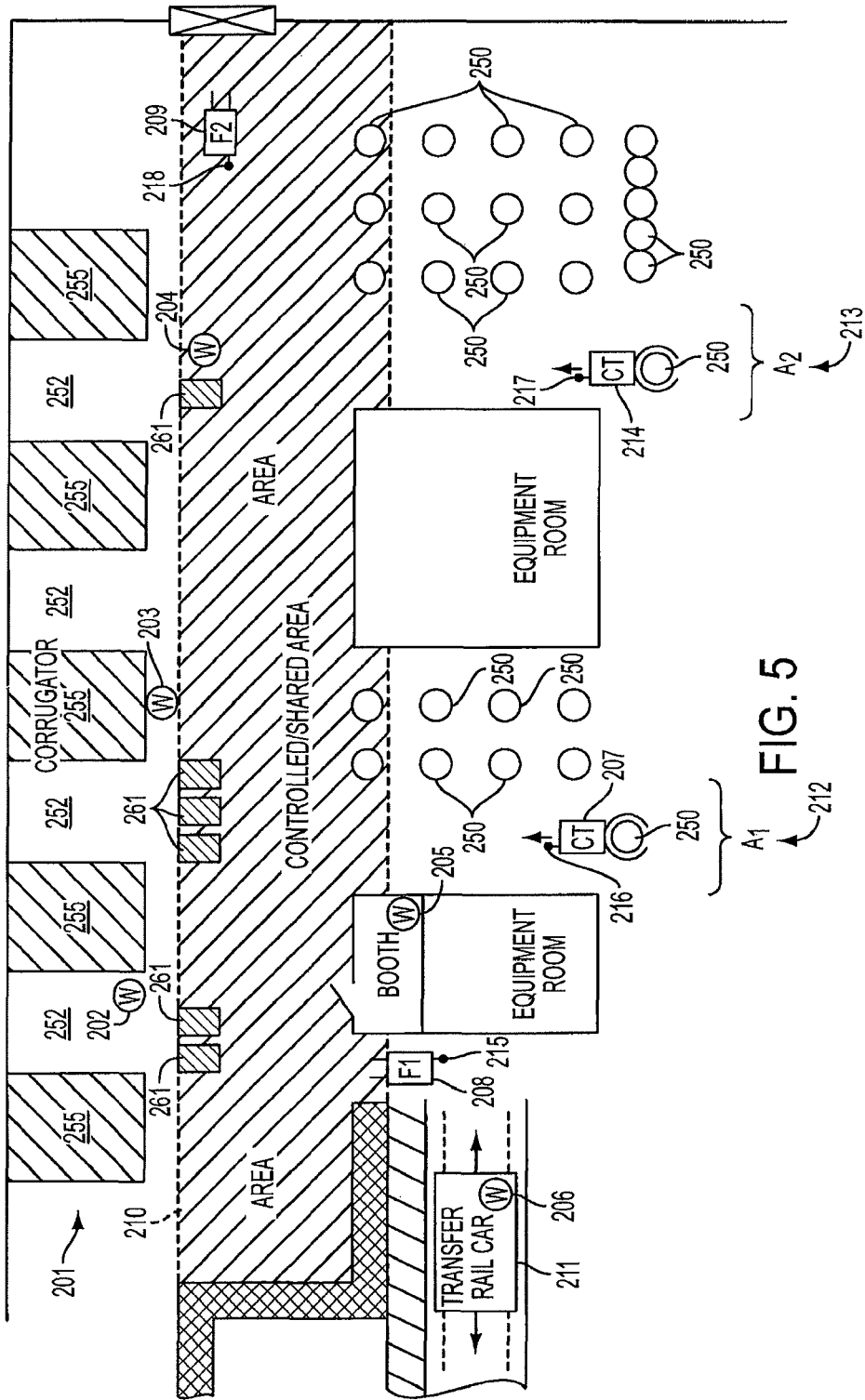
FIG. 5 is a diagram of an exemplary work site at which a mechanized area controller ("MAC") may be implemented.

An AREA 210 in FIG. 5, identified by hashed lines, must be used by pedestrians (202-206) and others not shown, by clamp trucks 207, 214 and by fork trucks 208, 209. Personnel not shown include maintenance personnel, managers, safety personnel, warehouse workers, visitors, etc. The clamp truck and the fork trucks may not always be the same machines from day to day. Also shown is a Transfer rail car 211 which moves materials. For purposes of this discussion, it is assumed that all the mobile machines and all personnel are outfitted with PDS/CA systems similar to those described in the Frederick patents.

After some study, it can be recognized that this is a complex operation, safety-wise. Not only must the pedestrians work in close proximity to the mobile machines but they must even share the same space. Obviously, the only way to safely share the same space is to ensure that the pedestrians and the machines do not try to share the same space at the same moment in time. The challenge is greater than what might be recognized at first glance because, for productivity reasons, it is desirable to allow pedestrians to be within this large area at one end while a mobile machine is at the other end. Workers 202, 203, 204 who are adjacent to the machine, not actually in the shared area 210, are safe so long as they do not enter the shared area 210. It is important that they not be warned when they are actually safe (such as by seeing a warning light that is not meant for them), even though they may be relatively close to machines that are in the area. Similarly, it is important that the operators of the clamp trucks 207, 214 or the fork trucks not be warned about the close proximity of workers who are actually in no immediate danger. Another danger is to pedestrians who are passing through the noisy area when a clamp truck suddenly enters the area through one of the aisles 212, 213. Many specific situations and scenarios could be cited where pedestrians could be in danger of being hit in the shared area and in the aisles A1 (212) and A2 (213). The MAC system, including the MAC-A and MAC-V, attempts to address all of these concerns.

In general terms, there are at least four major requirements for the MAC of the illustrated embodiment of FIG. 5. (1) Control the access to the shared area so that pedestrians or machines can be in the area but not both at the same time. (2) Control the speed of the clamp truck entering the area without limiting its speed as it leaves the shared area or at other locations in the facility. (3) Modify the operation of the PDS/CA system so that it will not produce nuisance alarms when entering the shared area but quickly return to normal operation upon exiting the area. (4) Control the movements in such a way to reduce confusion and to encourage orderly movements.

It is assumed that respective PDS/CA system components are installed on all of the mobile machines and the pedestrians. One MAC unit manages the sharing of the AREA 210. A second version of MAC (MAC-V) measures the speed and direction of clamp trucks approaching or leaving the AREA 210 via an aisle. In the specific case illustrated in FIG. 6, there are two aisles so that a third MAC (a MAC-V) is used there. The MACs provide signals to the PDS/CA systems, using magnetic fields, and issue signals to activate facility warning systems. Less complex applications may not require all of these elements. It should be pointed out that there are many variations to the example cited above. For example, there may be only one aisle or three aisles rather than the two shown. There may be only one clamp truck serving the operation with rolls of paper 250. The overall dimensions and arrangements may be different. But, most of the basic challenges will be present in most plants that have a corrugator machine 201. Note that the corrugator 201 extends above the floor plan shown in FIGS. 5 and 6 forming (between corrugator 201 portions 255) aisles 252 where workers and/or vehicles may enter. Also other portions 261 of the corrugator 201 intersect with the work floor in the shaded area 210. Corrugator 201 may extend above the aisles 252 and other areas.

Figure 6:
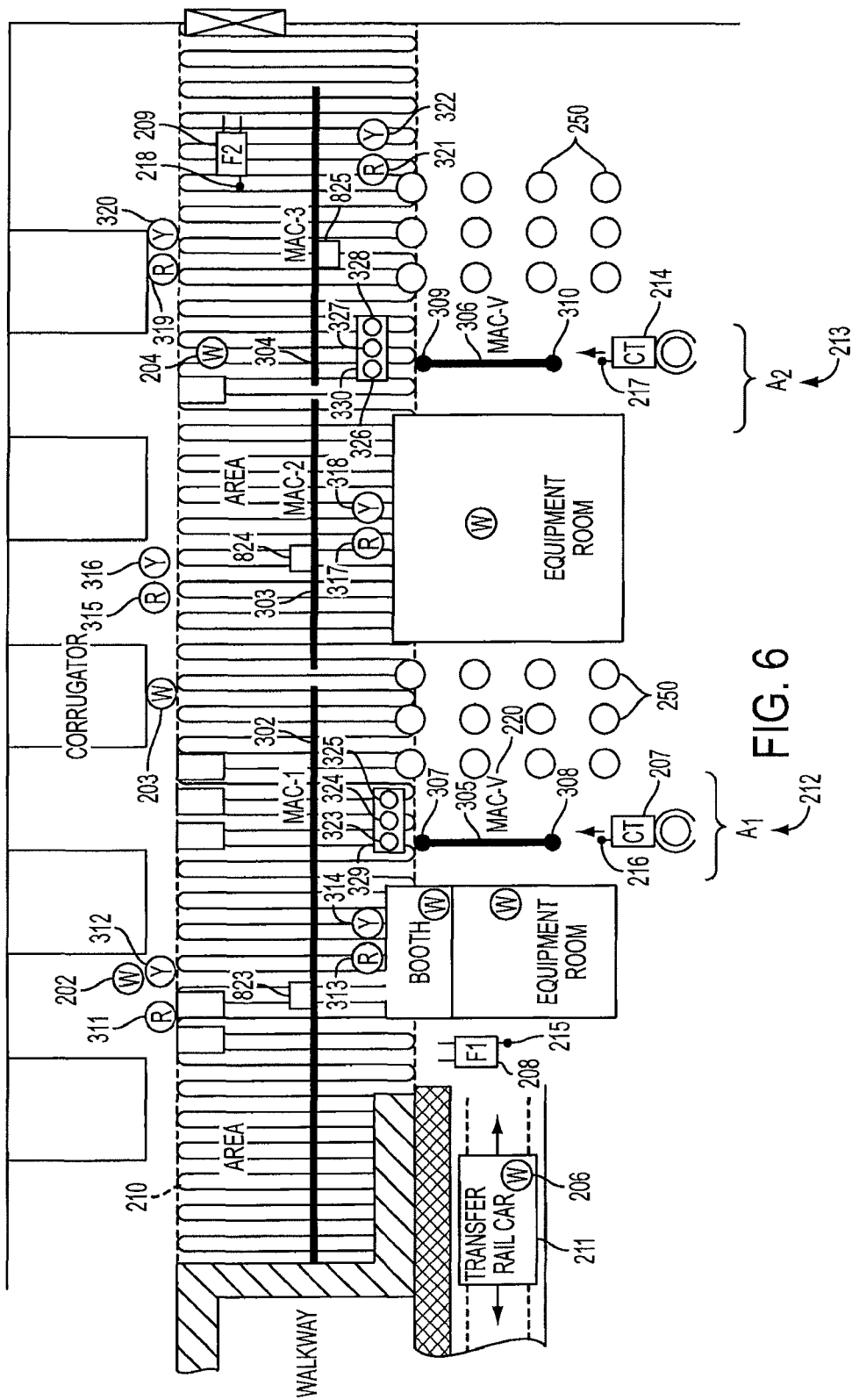
FIG. 6 is a diagram showing an exemplary implementation of MACs of the disclosed embodiments in the work site of FIG. 5.

Referring to FIG. 6, the hashed lines in FIG. 5 have been replaced with the wavy, sinusoidal lines to indicate that magnetic fields have been generated by MAC-As 302, 303, 304 to fill the AREA 210. Also, MAC-Vs 305, 306 have been placed above each aisle 212, 213.

The three MACs positioned above the AREA 210 generate pulses of oscillating low frequency magnetic fields so as to fill the AREA 210. These fields will be detected by the CA modules on the mobile machines if they are within the AREA 210. These fields will also be detected by the PADs carried by any pedestrians if in the AREA 210. If both mobile machines and PADs are in the AREA 210 at the same time, highly visible red lights will begin flashing around the AREA 210, until either the pedestrians or the machines leave. However, instead of making the MAC into a single unit, running the length of the AREA 210, it is made into three segments 302, 303, 304. Doing so may better accommodate a truck being in one end of the area 210 while pedestrians are in the other end. Some facilities may have a smaller shared area so that there would only be one or two MAC segments. In order to minimize confusion, an approaching clamp truck, delivering another roll of paper, will result in a highly visible yellow light being flashed to alert the pedestrians that a clamp truck is approaching. The sensing of an arriving clamp truck will be sensed by the MAC-Vs 305, 306 above the aisle(s) 212, 213. Facility warning lights are activated by the MACs and MAC-Vs as needed to encourage an orderly movement of pedestrians as the trucks move from one portion of the AREA to another.

For example, an operator on a truck 207 that is approaching the shared area needs to know if there is a pedestrian in the AREA 210 or in the part of the shared area to be entered by the truck 207. If there are no pedestrians in the AREA 210, a green light 323 in the traffic control unit 329 will be turned on at the end of the aisle 212 by the MAC-1 302 and the operator can drive into the area. If a pedestrian is present in a portion of the AREA 210 to be entered by the truck 207, a yellow light 324 in the Traffic Control Unit 329 at the end of the aisle 212 will be lit. Seeing the yellow light, the operator of the truck 207 should either stop the truck until the area is clear or slow the truck 207 and look carefully until the pedestrians vacate the AREA 210, depending upon the strategy used by the safety director.

Since pedestrians will be warned in a highly visible manner to vacate the AREA 210 before the truck 207 arrives, the danger of being hit has been essentially eliminated. However, if their PADs and if the warning lights on the truck 207 give warnings even after they know that the danger has been removed, these nuisance alarms will drastically degrade the effectiveness of the system and can create confusion. It is important for workers to be assured that when warnings are given, action is required. False warnings and nuisance alarms must be eliminated. The MAC inhibits nuisance alarms from being caused from misdirected instructions, by sending a specially coded set of pulses via the magnetic field into the AREA 210 which are then sensed by the PDS/CA systems. The micro-controller in the PDS/CA system either shrinks or stops producing the magnetic fields on the machine, depending upon the choice coded into the software. The choice between these options depends upon other peripheral factors. When the trucks leave the AREA 210, their PDS/CA systems will resume operations as required for entering the warehouse where large safety zones around the machines are desired.

It is worth noting that use of the magnetic field to modify the way the PDS/CA systems function has the important benefit of only affecting the machines that are in the field, which is precise and stable. RF transmissions could be used except they are difficult to control and they are prone to propagate outside the AREA 210 and affect the operation of nearby machines that are not in the AREA 210. Confusing or false indications or unintended actions are unacceptable for a safety system or, otherwise, users will lose confidence in the system and ignore its warnings.

Steps must be taken to control the approach to the AREA 210 by the trucks. A Traffic Control Unit 329, mentioned earlier, having a set of three lights, is positioned at the end of the aisle 212 leading to the AREA. One light 323 is green to indicate that there are no pedestrians in the AREA 210 ahead. Another light 324 is yellow and would indicate if there is a pedestrian in the AREA 210. A third, red light 325 will indicate if the truck is approaching too rapidly. In addition, as the truck is approaching there will be two points at which the PDS/CA warning light on the truck will be flashed. Ideally, this light would be a highly visible type.

The MAC-Vs 305, 306 are positioned above the aisles 212, 213 so that they can measure the speed and direction of the trucks. If the truck approaches at a speed greater than the limit set by the safety director, the sensor on the end of the MAC that is closest to the truck will initiate a signal to the PDS/CA system on the truck and it will flash the light a couple of times to warn the operator that the truck needs to be slowed down. If the truck is still going too fast when its speed is measured by the second sensor, then a danger signal will be sent to the PDS/CA system and the warning light will be flashed for an extended period of time to alert the operator and other personnel that the truck is going too fast. While underneath the MAC-V 305 or 306, the safety zone produced by the PDS/CA will be reduced, if the truck 207 is traveling at less the speed limit for that location. If the truck is exiting, the MAC will detect the outgoing direction and no signals will be given. It is expected that the truck will quickly resume higher speeds upon returning to the warehouse and the safety zone produced by the PDS/CA will return to full size.

If a clamp truck or fork truck is a modern version having an electronic control center, the signals sent to the truck by a MAC to the PDS/CA will be routed from the PDS/CA to the machine control center to take actions that are appropriate for the situation. For example, the machine might be automatically slowed down when notified that the truck is moving too fast for that specific location. In some instances, if already moving at a slow speed, the truck might be automatically stopped, as is being accomplished on underground mining equipment by similar type PDS/CA systems.

The PDS/CA systems and the MAC and MAC-V routinely output a RF data set that contains information about safety events. This information can be received by a RF receiver, sent into a data storage and retrieval system. This information can be used to evaluate the events leading up to a hit-by accident, to improve traffic control, or non-safety functions such as evaluating the efficiency and utilization of the truck.

Figure 7:
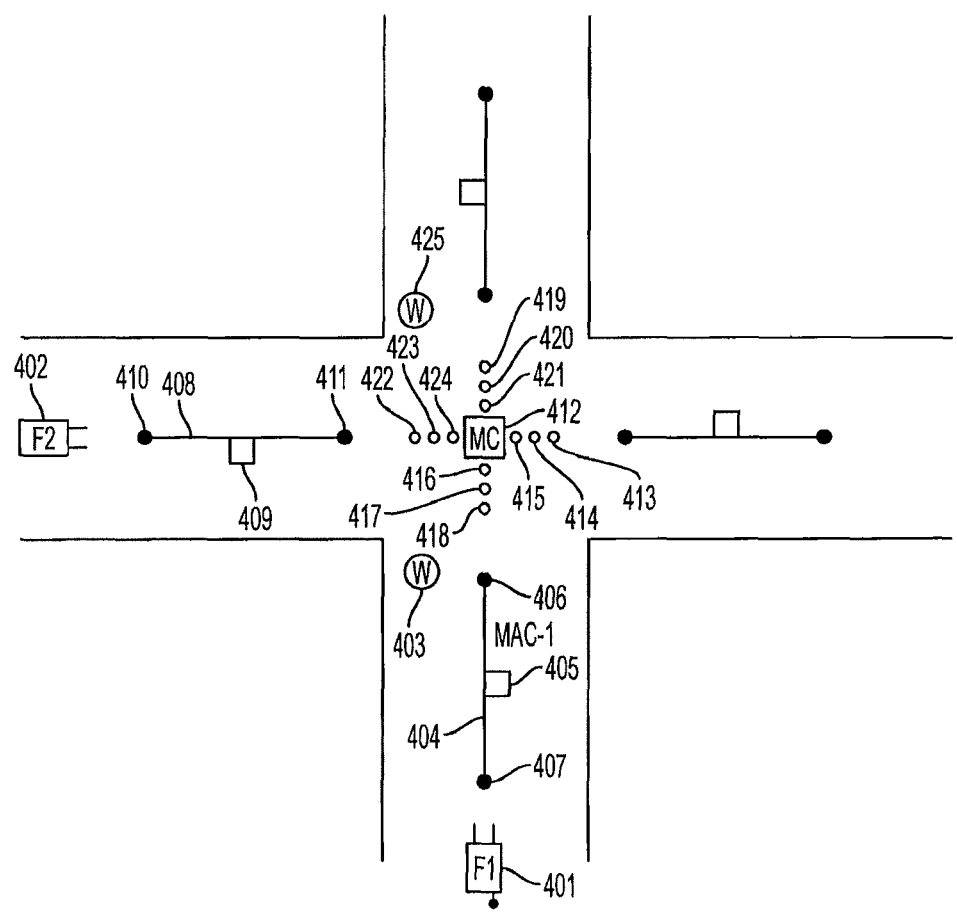
FIG. 7 is a diagram showing an exemplary implementation of MACs of the disclosed embodiments at another exemplary work.

Many kinds of situations exist in industrial settings where a MAC could be useful for improving safety and most are not as complex as the corrugator example described above. An example is a junction in a plant where mobile machines and pedestrians frequently pass. In order to not be a hindrance to orderly and efficient movements of machines and people, it is desirable to alter the operation of the PDS/CA systems on the machines. FIG. 7 illustrates a four-way junction in which mobile machines may approach from any direction and pedestrians may be in any location, their direction of travel being unrestricted. If multiple machines, equipped with PDS/CA approach the junction there will be multiple warnings and potential confusion. If pedestrians are also present, the situation can be confusing, preventing orderly safe movements of all.

Many scenarios can be imagined where accidents can happen at a four-way intersection where visibility is limited for pedestrians and operators. One solution might be to create a four-way stop but there are reasons why this may not be optimum for an industrial setting. Views by pedestrians may be obstructed. The majority of the traffic may be in one aisle. The majority of the traffic may be pedestrians. Conventions for highway traffic may not be suitable. Multiple logic options can be used as preferred by the traffic control specialist, considering the specific needs at a particular situation. One question to be considered is whether pedestrians generally have the right-of-way priority over trucks. Another is whether to give some aisles preference or to give some directions preference over others. Another question is whether to always give priority to the first-to-arrive. Most any logic is easy to implement for a particular junction, by use of MAC, since the output of direction and speed can be provided by each MAC to the Traffic Control Unit 412. The Traffic Control Unit 412 has red 413, 418, 422, 419, yellow 414, 417, 423, 420, and green lights 415, 416, 421, 424 pointing in the direction of each of the four aisles and has a micro-controller. By using the Traffic Control Unit, the movements of trucks and pedestrians can be managed. If a truck is approaching too fast from any direction all the red lights can be made to flash until the truck has left the area. If all trucks are approaching at a safe speed, they can be commanded to shrink their safety zones to correspond to their low speed. Then the logic selected by the safety director can signal passage through the junction in an orderly manner. And, the MACs can issue pulse patterns that will be recognized by the PDS/CA systems as a call for silencing the warnings so that no one will be receiving warnings, once all vehicles are stopped or moving very slowly and are being given signals as to how they should move.

A MAC-A or MAC-V can also be used in congested areas such as loading docks. For example, it can give a signal to the PDS/CA systems as fork trucks arrive to automatically reduce the size their safety zones. Also, by changing the pattern of the magnetic fields, the PDS/CA can be commanded to be made silent and/or the PADs in the area can be made silent. Once PDS/CA systems have been deployed into a facility, MACs can be installed into those areas where it is desirable to alter the operation of the PDS/CA functionality and to provide new functions.

In the application shown in FIG. 6, three MACs are positioned at 11 feet above the floor to give room for clamp trucks and fork trucks to pass beneath. The MACs may be suspended from the ceiling or attached to other structures. The height of the MAC may be higher or lower, but should be high enough to allow room for work activity to be conducted beneath the MAC without hitting it, but should not be so high so that the MAC's function is unacceptably adversely affected. The primary function of these three MACs is to control the AREA 210 to prevent pedestrians and mobile machines from being in the same part of the AREA 210 at the same time. In the chosen illustration, it is desirable to allow trucks to be at one end of the AREA 210 while pedestrians can be in the other end.

Figure 8:
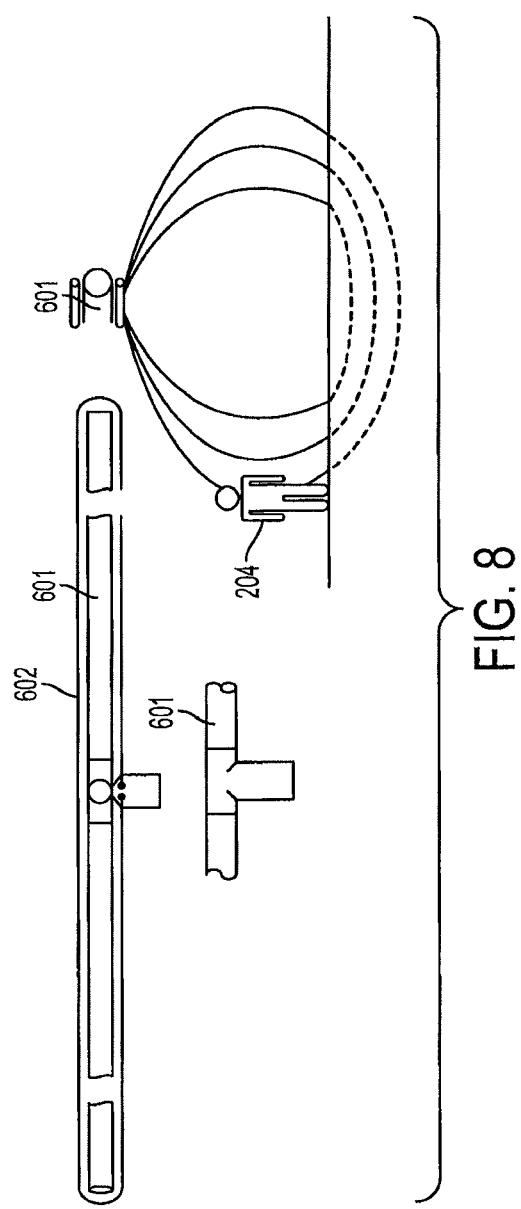
FIG. 8 is a schematic diagram of an exemplary embodiment of MAC field generation.

A MAC will typically utilize three methods of communicating with the PDS/CA systems. Refer to the diagram in FIG. 8. A MAC can be suspended above a work area, aisle, walkway, or roadway. A loop of wire is attached to a non-metallic support which produces a magnetic field when current passes through the loop. The magnetic field lines are essentially in a plane that is perpendicular to the MAC support tube. At each end of the MAC is another generator that produces a magnetic field that is circular in the horizontal plane. The electronics control module has an UHF transmitter and a UHF receiver, along with other items such as a micro-controller and capacitors to match the reactance of the loop. Magnetic fields produced by the loop are detected by the Collision Avoidance section of the PDS/CA systems on the mobile equipment. These fields are also detected by the PADs carried by the pedestrians. Both the PDS/CA systems and the PADs respond to the MAC via UHF transmitters. The RF transmissions can also be made in other frequency spectrums if desired without changing the functionality of the MAC.

A fundamental element of a MAC is a loop of wire 602 that is attached to a supporting tube 601, made of a nonmetallic material such as PVC. Larger wire is desired in order to maintain a high "Q" in the resonant circuit. A higher Q produces a higher peak voltage which produces a higher peak current. The size of the field is proportional to the cube root of the current in the loop. A suitable low frequency would be less than about 100 kHz. A frequency in the general range of about 70 kHz to about 75 kHz has been found to be useful, being low enough to not be exhibit parasitic coupling to metal objects while being high enough to allow conveying logical instructions in a reasonable time. Some systems, such as HazardAvert® and Hit-Not®, operate at about 73 kHz.

By varying the supply voltage, the size of the magnetic field can be increased. The example described earlier, showing the three devices behind a corrugator machine, which is about 150 feet long, were selected to be about 50 feet in length each. By measuring the inductance of the loop, the required capacitance can be selected. A person skilled in the art of designing electronic circuits can easily select capacitor sizes and operating voltages to create a magnetic field of the desired diameter and length. Where needed, the length can be increased to hundreds of feet if the field diameter does not have to be large. In this case, the wire loop could be constructed from insulated #10 AWG copper wire.

Figure 9:
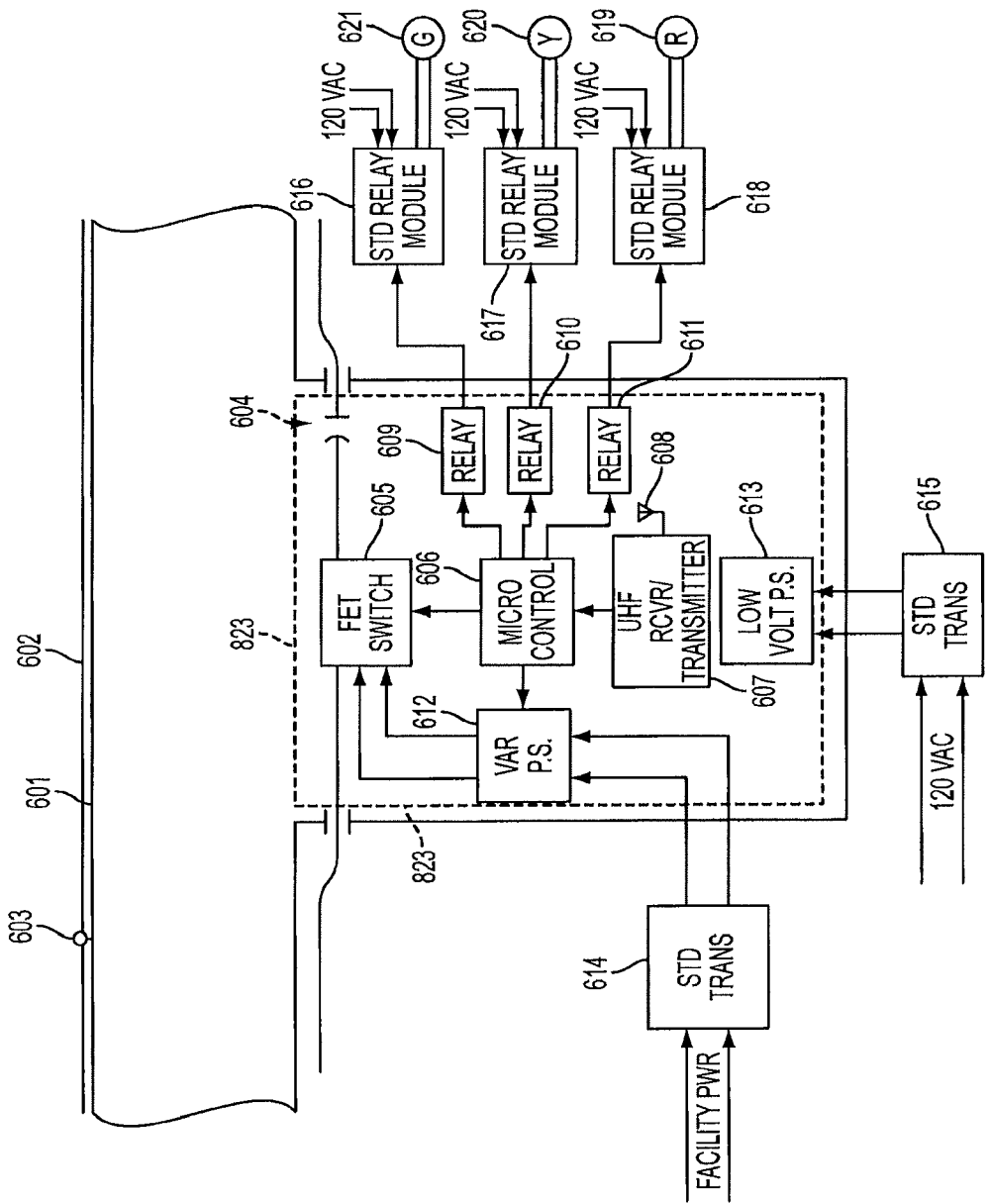
FIG. 9 is a diagram of an exemplary embodiment of a MAC device of the disclosed embodiments.
Figure 10:
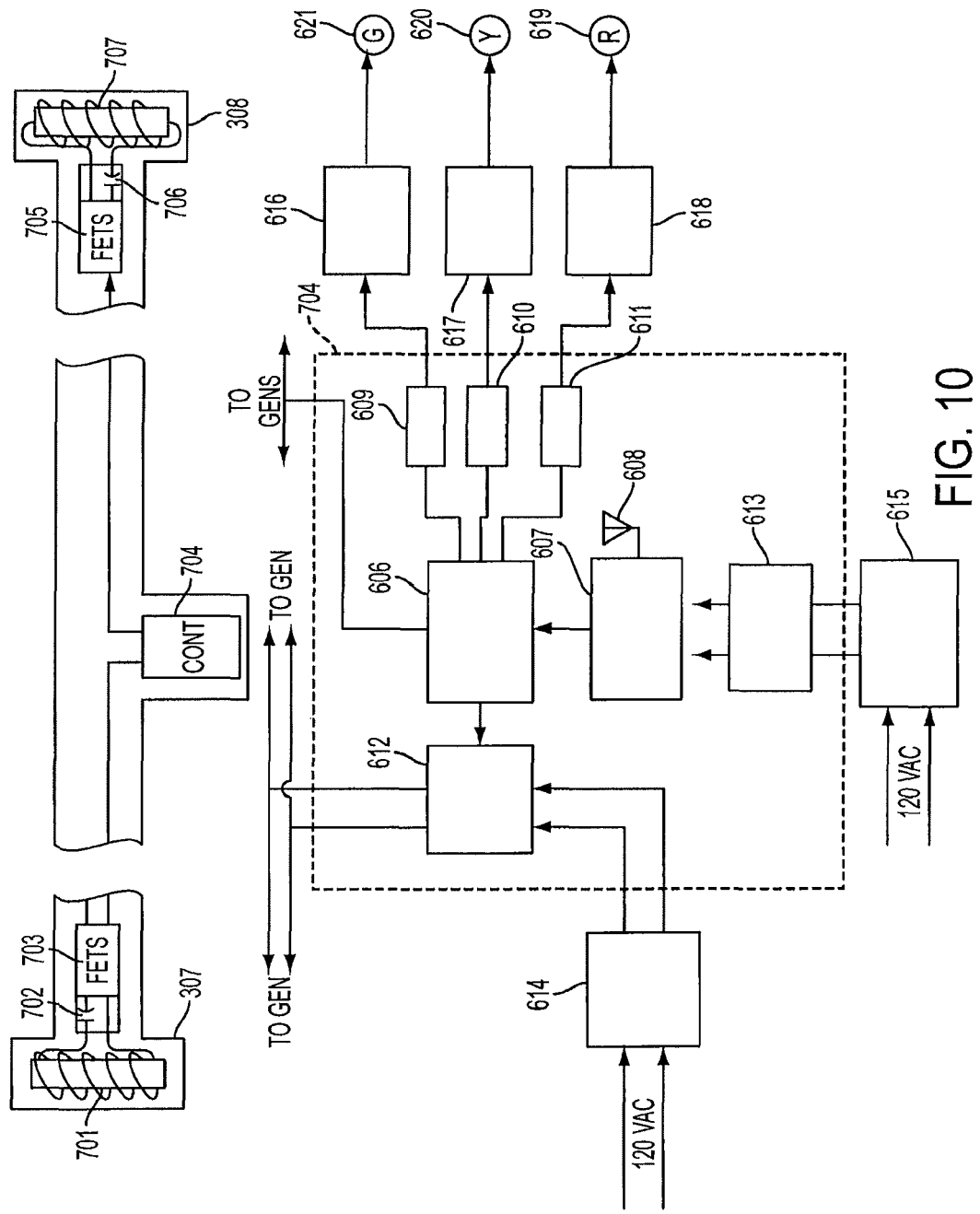
FIG. 10 is a diagram of an exemplary embodiment of a MAC-V device of the disclosed embodiments.

An electrical diagram for the MAC is shown in FIG. 9. The linear magnetic field is produced by switching the power being supplied by the external power supply 614 at the 73 kHz frequency to which the resonant circuit will resonate. The switching is controlled by the micro-controller 606 in the controller module 823, 824, 825. Transmissions of logical functions or response signals from PADs of workers 202-206 and collision avoidance (CA) modules 216, 217 are received by a UHF receiver 607, via antenna 608. The output from the receiver 607 is fed to the micro-controller 606. Ping echo sequences, as described in the Frederick patents are controlled by the micro-controller 606. Voltage to the electronic elements is supplied from external power supply 613. These external power supplies can be types that are commercially available, UL listed units, that accept standard 120 VAC, 60 cycle, or other standard power. Examples would be model DSA-60 W-12 power supply, available from multiple electronics distributors. Highly visible lights in the facility are powered from facility power though relays inside commercially available units such as Honeywell Model R8845U switching relay. By using commercially available, UL Listed power modules, the MAC units operate entirely on low voltage.

The two other magnetic field generators 307, 308, one mounted at each end of the MAC, are conventional PDS units of a type currently used for proximity detection except that the ferrite has been oriented with the long axis of the ferrite being vertical. This orientation produces a magnetic field below the MAC which is circular in the horizontal plane. The ferrite is much smaller than would be required for a PDS system on a mobile machine since the required range is much less. In some instances, these two magnetic field generators can be replaced with sensing units, similar to those used in PADs, which will sense the fields produced by the PDS systems on the mobile machines passing near the MAC.

The following paragraphs will discuss how the logical decisions are made within the MAC.

Logical decisions in the MAC are made by the micro-controller 606 in the control module 823. While in the process of preventing simultaneous use of the AREA 210 by both pedestrians and clamp trucks or fork trucks, the micro-controller 606 sends a series of control pulses to the FETs 605 at the rate of 73 kHz for a duration of 0.003 seconds. The resonant circuit made up of the loop and the capacitors 604 on the control board, begins to resonate and produces a magnetic field around the loop. One side of the loop 602 is positioned on the support tube 601 on the side nearest the floor and the other side of the loop is on the top of the support tube. Each lobe will be somewhat circular with the magnetic lines in a plane that is perpendicular to the tube. The pulse of oscillations that is produced is called a Ping. Any PAD or PDS/CA within the range of the Ping will measure its strength and if strong enough to be at the Danger level, it will send a response, called an Echo, via a UHF transmitter. In the US, the chosen UHF frequency of the Echo might be 916 MHz.

The strength of field chosen as the level for which a decision will be made can conveniently be chosen to be the same as the level already being used by the PDS/CA systems, or some other level. The exchange of Pings and Echos establishes that there is either a PAD or a PDS/CA system in the AREA, or both. A typical PDS/CA system will perform a cross check or handshake to ensure that errors are not made in the decisions. For example, the Ping/Echo may be repeated, following a precise protocol to confirm the result of the first Ping/Echo sequence. This could be repeated many times, though a total of three sequences has been shown to provide very high reliability in most environments. The decision elements must know how many iterations are necessary to complete the exchange. In normal PDS/CA operations, the objective would be to complete the required number of exchanges in order to validate an operational condition. That is not true for the use of the MAC. A purpose of using the MAC is to take actions to prevent pedestrians and operators from trying to being in the AREA 210 at the same instant, without giving unnecessary warnings.

In this application, it is important that the MAC not cause the PADs or the PDS/CA systems to go into a Warning state or Danger state which would produce alarms to the pedestrians and to the operator. However, it is important to know whether PADs or trucks having PDS/CA systems are in the AREA 210. The PDS/CA system assumed for this illustration requires that three Ping/Echo sequences be properly completed before a decision can be made. Therefore, the MAC only sends a total of two Pings for a sequence, not the required three, so that the MAC sequence should not result in a decision being made to produce an alarm. Additional pairs of Pings will typically be sent each second. By requiring that the decisions be made when the field strength measured by the PADs or the PDS/CA systems be at the Danger level, the chance of an error for dual Pings at such high levels is very small. But, the MAC can actually require a minimum of two sets of dual Pings or more, receiving the corresponding Echos, before making decisions. This is possible since the response time for this application is less than, for example, inside a mine where workers are only a few feet from a machine, and fast response is essential. Further, the PDS/CA systems within the AREA 210 will be commanded by the MAC to stop generating fields while inside the AREA 210 which will further reduce the chance of making an error due to conflicts. It is worth noting at this point that a well-designed PDS/CA system will already incorporate various algorithms to analyze the characteristics of Pings and Echos to determine if are valid. Incorporating all these steps ensures that false alarms and nuisance alarms will not be caused by erroneous signals.

Once the MAC has verified that there are no PADs in the AREA 210, it sends a signal to operate a relay in the module 616 which will switch facility power to the green light 621 (or in FIG. 6 green lights 323, 326 at the end of the aisles 212, 213 respectively). However, if MAC senses a PAD in the AREA 210, it will turn on a yellow light 620. Once a truck has entered the AREA 210, in any of the three segments under MAC-1 302, MAC-3 303, or MAC-3 304, if any PAD enters the AREA 210, the micro-controller in the associated MAC will send a signal to relay module 619 which will switch facility power to the set of high visibility red lights around that segment of the AREA 210 so that all personnel will know that both a pedestrian and a truck is present. The pedestrian should vacate the AREA 210, unless the safety director has given other instructions and procedures.

The three MACs 302, 303, 304, using the above provisions and logic, should be able to prevent simultaneous presence in any of the three segments of AREA 210 by both one or more pedestrians and one or more trucks.

Managers of operations of the type being discussed here have expressed the danger that is caused by clamp trucks approaching or entering a complex work zone like the AREA 210. Not only is it important to alert the operator of approaching trucks when there is a pedestrian in the portion of the AREA that the truck is about to enter, it is also important that the trucks approach slowly. Not only is it possible that a pedestrian might be about ready to enter the AREA 210 but pedestrians are frequently nearby, though not actually in the AREA 210. Due to some locations not always being visible and due to the high level of activity, a pedestrian may step in front of an approaching truck. For example, with reference to the truck 207 in aisle 212, to help prevent this from happening, a MAC-V 305 is placed above the aisle 212 to measure the speed of the truck 207 moving toward the AREA 210 and to give an alarm if it is moving too rapidly. The micro-controller 606 will alternate generating Pings from the generator 703, 707 in each end 307, 308 of the MAC. If a truck is close enough to be in range of the Pings, it's PDS/CA will respond with Echos. As with the MACs over the AREA, it would be desirable that the echos at the Danger level be used rather than the warning level, because the signal-to-noise ratio is higher at the danger level. The micro-controller 606 in the MAC-3 module 825 will initiate an exchange of two more Ping/Echo sequences to confirm that the signals are valid. Once that has been confirmed, the micro-controller 606 will send a data set through the UHF link to notify the PDS/CA that its speed is to be measured. The PDS/CA will begin to sense the pulses and measure their strength. The period of time between pulses can be pre-set or it can be transmitted to the PDS/CA via the data set. For purposes of this illustration, assume that a total of five pulses are sent, spaced 50 milliseconds apart. The amplitude of the oscillating magnetic field being sensed by the PDS/CA will increase inversely proportional to cube of the distance. Since the distance at which the PDS/CA will sense the magnetic field to be at the Danger level, the distance is known at which the speed calculations will begin. The micro-controller will then calculate the speed at which the truck is moving between each pulse. The four readings will be averaged and compared to the value set into the MAC for this location. A suitable limit might be 5 feet per second. Assuming that the magnetic field is adjusted to produce a magnetic that is approximately 20 feet in diameter for the Danger level, then during the 200 milliseconds from the first pulse to the fifth pulse, the truck would move one foot. During that time the strength of the magnetic field would increase approximately by the cube 10/9, or 37%. This should allow a sufficiently accurate speed measurement for most situations. If more accuracy is desired, the measurements can be fitted to a curve, more pulses can be sent, and/or the size of the magnetic field can be increased.

The PDS/CA would be programmed to recognize if the speed exceeds 5 feet per second. If so, it would flash the PDS/CA warning lights on the truck to alert the operator that the truck is moving too fast for this location.

Since a truck that is near MAC-3 will be detected regardless of whether it is approaching the AREA or exiting AREA, it is necessary to know which way that it is travelling. While it may be desirable to slow the approach speed to no more than 5 feet per second, it may also be desirable to allow a truck that is exiting to begin accelerating up to a more typical speed of 20 feet per second, or more, for work to be performed in the warehouse. Prior to the MAC-V 305 starting measurement of the speed of truck 207, it would be alternately be generating Pings from by the generator 707 on the other end 308. Logic in the micro-controller 606 determines the direction by comparing timing and field strength. If a truck is incoming, then the micro-controller schedules to begin making speed measurements.

There is another important function to be performed. If a truck is determined to be approaching, the MAC-V 305 sends an "approach" signal to the MAC-1 302 through the interconnecting cable. If there is a pedestrian in the AREA 210 near MAC-1, then it will turn on a highly visible yellow light 314 to alert pedestrians to clear the area. A similar response would be happen if a truck was in the other aisle, approaching the AREA near MAC-V 306.

By having the MACs 302, 303, 304 in the example illustrated above, safety in the complex shared AREA behind the corrugator machine would be made safe by preventing both pedestrians from being in the same area at the same time, by controlling the approach of trucks, and by giving appropriate warnings to operators and pedestrians. All this is accomplished without producing nuisance alarms or false alarms. The overall effect will be to make the area much safer while not impacting production. It also removes the need to take more drastic actions such as placing governors on machines or of preventing pedestrians from being in areas where they need to be in order to do their work efficiently.

Figure 11:
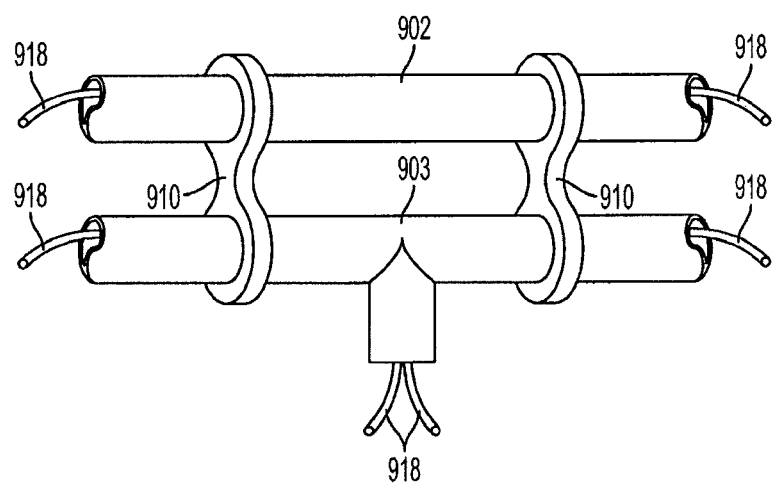
FIG. 11 is a diagram of another exemplary embodiment of a MAC device of the disclosed embodiments.

With reference to FIG. 11, instead of a single support pipe, the MAC may include two support pipes 902, 903 held separated in parallel by spacers 910. The loop 918 may be placed inside the pipes and loop back at the respective ends of the pipes (a suitable fitting may be provided) and may enter and exit the pipes 902, 903 at a control module and fitting similar that described with respect to a single pipe embodiment. The pipes 902, 903 may be a smaller diameter so the two parallel lengths of the loop 918 are held at a relatively uniform spacing from one another, such as about two to three inches. A common one-half inch nonconductive plastic pipe should work.

The MAC described above can be used in numerous other situations where PDS/CA systems are highly desirable in general but are troublesome when used in some mechanized areas involving multiple machines and other personnel.

The above description and drawings are only illustrative of preferred embodiments, and are not intended to be limiting. Any subject matter or modification thereof which comes within the spirit and scope of the disclosure is to be considered part of the present invention.

The invention claimed is:

1. A traffic control system, the system comprising:
   a first magnetic field generator, for generating a first zone magnetic field defining a first zone, mounted over an aisle, the first magnetic field generator being adapted to generate a plurality of magnetic field pulses, wherein each of the magnetic field pulses are separated by a period of time;
   a first magnetic field detector affixed to a vehicle and configured to detect a strength of each of the plurality of magnetic field pulses and to generate a vehicle response signal indicative of the strength of each of the plurality of magnetic field pulses; and
   a controller configured to receive the vehicle response signal, the controller further configured to determine a speed of the vehicle based on the period of time and the strength of each of the plurality of magnetic field pulses indicated by the vehicle response signal and to generate a control signal for the vehicle based on the speed of the vehicle determined by the controller.

2. The traffic control system of claim 1, wherein the controller is mounted above the aisle.

3. The traffic control system of claim 1, further comprising a second magnetic field generator affixed to the vehicle and configured to generate a second magnetic field defining a vehicle danger zone, wherein the controller is configured to generate a control signal to reduce a size of the danger zone based on the speed of the vehicle determined by the controller.

4. The traffic control system of claim 3, wherein the controller is configured to generate the control signal to reduce the size of the danger zone only if the speed of the vehicle is below a predetermined speed.

5. The traffic control system of claim 3, wherein the control signal to reduce the size of the danger zone is one of: a radio frequency (RF) signal and a pattern of magnetic field pulses.

6. The traffic control system of claim 3, further comprising a second magnetic field detector configured to generate an alarm if the second magnetic field detector is within the vehicle danger zone.

7. The traffic control system of claim 6, wherein the second magnetic field detector is worn by a user.

8. The traffic control system of claim 1, wherein the controller is configured to generate a control signal to reduce a speed of the vehicle based on the speed of the vehicle determined by the controller.

9. The traffic control system of claim 8, wherein the controller is configured to generate the control signal to reduce the speed of the vehicle only if the speed of the vehicle determined by the controller is above a predetermined speed.

10. The traffic control system of claim 8, wherein the control signal to reduce the speed of the vehicle is one of: a radio frequency (RF) signal and a pattern of magnetic field pulses.

11. The traffic control system of claim 8, wherein the controller is further configured to determine a direction of the vehicle and the controller is configured to generate the control signal to reduce a speed of the vehicle if the vehicle is traveling in a first direction and not if it is traveling in a second direction.

12. The traffic control system of claim 1, wherein the period of time is pre-set.

13. The traffic control system of claim 1, wherein the period of time is transmitted to the first magnetic field detector.

14. The traffic control system of claim 1, wherein the first magnetic field detector is configured to detect the strength of each of the plurality of magnetic field pulses after receiving an initiation pattern of magnetic field pulses.

15. A traffic control method, the method comprising:
   generating a first zone magnetic field defining a first zone by a first magnetic field generator mounted over an aisle, the first magnetic field generator being adapted to generate a plurality of magnetic field pulses, wherein each of the magnetic field pulses are separated by a period of time;
   detecting a strength of each of the plurality of magnetic field pulses by a first magnetic field detector affixed to a vehicle;
   generating, by the first magnetic field detector, a vehicle response signal indicative of the strength of each of the plurality of magnetic field pulses;
   receiving the vehicle response signal at a controller;
   determining, by the controller, a speed of the vehicle based on the period of time and the strength of each of the plurality of magnetic field pulses indicated by the vehicle response signal; and
   generating, by the controller, a control signal for the vehicle based on the determined speed.

16. The traffic control method of claim 15, wherein the controller and the first magnetic field generator are mounted above the aisle.

17. The traffic control method of claim 15, further comprising generating a control signal to reduce a size of a danger zone of a second magnetic field generator based on the determined speed of the vehicle, the second magnetic field generator being affixed to the vehicle.

18. The traffic control method of claim 17, wherein control signal is generated to reduce the size of the danger zone only if the speed of the vehicle is below a predetermined speed.

19. The traffic control method of claim 17, wherein the control signal to reduce the size of the danger zone is one of: a radio frequency (RF) signal and a pattern of magnetic field pulses.

20. The traffic control method of claim 15, further comprising generating, by the controller, a control signal to reduce a speed of the vehicle based on the determined speed of the vehicle.

21. The traffic control method of claim 20, wherein generating the control signal to reduce the speed of the danger zone occurs only if the speed of the vehicle is above a predetermined speed.

22. The traffic control method of claim 20, wherein the control signal to reduce the speed of the vehicle is one of: a radio frequency (RF) signal and a pattern of magnetic field pulses.

23. The traffic control method of claim 20, further comprising: determining, by the controller, a direction of the vehicle and generating the control signal to reduce a speed of the vehicle if the vehicle is traveling in a first direction and not if it is traveling in a second direction.

24. The traffic control method of claim 17, further comprising:
    detecting the danger zone with a second magnetic field detector; and
    generating an alarm in response to the detecting the danger zone.

25. The traffic control method of claim 24, wherein the second magnetic field detector is worn by a user.

26. The traffic control method of claim 15, wherein the period of time is pre-set.

27. The traffic control method of claim 15, wherein the period of time is transmitted to the first magnetic field detector.

28. The traffic control method of claim 15, further comprising detecting the strength of each of the plurality of magnetic field pulses after receiving an initiation pattern of magnetic field pulses by the first magnetic field detector.

* * * * *